(12) United States Patent
Zierle (10) Patent No.: US 12,030,472 B2
(45) Date of Patent: Jul. 9, 2024

(54) TEST UNIT FOR AN ACTUATION DEVICE OF AN ELECTRICAL APPARATUS

(71) Applicant: Robert Bosch GmbH, Stuttgart (DE)

(72) Inventor: Daniel Zierle, Neudenau (DE)

(73) Assignee: Robert Bosch GmbH, Stuttgart (DE)

( * ) Notice: Subject to any disclaimer, the term of this patent is extended or adjusted under 35 U.S.C. 154(b) by 359 days.

(21) Appl. No.: 17/600,299

(22) PCT Filed: Feb. 7, 2020

(86) PCT No.: PCT/EP2020/053111
§ 371 (c)(1),
(2) Date: Sep. 30, 2021

(87) PCT Pub. No.: WO2020/200554
PCT Pub. Date: Oct. 8, 2020

(65) Prior Publication Data
US 2022/0203954 A1 Jun. 30, 2022

(30) Foreign Application Priority Data

Apr. 3, 2019 (DE) .................... 10 2019 204 758.0

(51) Int. Cl.
*B60T 17/22* (2006.01)
*B60T 8/88* (2006.01)
(Continued)

(52) U.S. Cl.
CPC ............ *B60T 17/221* (2013.01); *B60T 8/885* (2013.01); *G01R 31/3277* (2013.01); *B60T 13/746* (2013.01); *B60T 2270/406* (2013.01)

(58) Field of Classification Search
CPC ...... B60T 17/22; B60T 17/221; B60T 13/746; B60T 8/885; B60T 13/74; B60T 17/18;
(Continued)

(56) References Cited

U.S. PATENT DOCUMENTS 6,158,822 A * 12/2000 Shirai ..................... F16D 65/22
303/162
11,447,111 B2 * 9/2022 Rebholz-Goldmann ....................
B60T 13/741
(Continued)

FOREIGN PATENT DOCUMENTS

CN 1428631 A 7/2003
CN 108688679 A 10/2018
(Continued)

OTHER PUBLICATIONS

German Patent No. DE 102018220583 to Zierle published on Jun. 4, 2020.*
(Continued)

*Primary Examiner* — Pamela Rodriguez
(74) *Attorney, Agent, or Firm* — Maginot, Moore & Beck LLP (57) ABSTRACT

A test unit for an actuation device of an electrical apparatus is configured as an ASIC and includes a test circuit configured to generate a voltage test sequence, a memory configured to store a response pattern, and an analysis unit configured to compare the response pattern with a reference pattern.

11 Claims, 4 Drawing Sheets

(51) Int. Cl.
*B60T 13/74* (2006.01)
*G01R 31/327* (2006.01)

(58) Field of Classification Search
CPC ........... B60T 2270/415; B60T 2270/40; B60T 2270/406; G01R 31/3277
See application file for complete search history.

(56) References Cited

U.S. PATENT DOCUMENTS

| | | | | |
|---|---|---|---|---|
| 2013/0282249 | A1* | 10/2013 | Heise | B60T 13/746 701/70 |
| 2013/0314222 | A1* | 11/2013 | Park | B60T 13/741 340/453 |
| 2018/0079398 | A1 | 3/2018 | Baehrle-Miller et al. | |
| 2018/0079399 | A1 | 3/2018 | Baehrle-Miller et al. | |
| 2020/0164892 | A1* | 5/2020 | Plecko | B60W 50/04 |
| 2023/0054729 | A1* | 2/2023 | Vinci | B60T 8/885 |

FOREIGN PATENT DOCUMENTS

| | | |
|---|---|---|
| CN | 108973967 A | 12/2018 |
| DE | 102 61 042 A1 | 8/2003 |
| DE | 10 2017 209 319 A1 | 12/2018 |
| DE | 10 2017 215 996 A1 | 3/2019 |

OTHER PUBLICATIONS

Translation of German Patent No. DE 102017209319 obtained from website: https://worldwide.espacenet.com on Nov. 20, 2023.*
International Search Report corresponding to PCT Application No. PCT/EP2020/053111, mailed May 4, 2020 (German and English language document) (5 pages).

* cited by examiner

TEST UNIT FOR AN ACTUATION DEVICE OF AN ELECTRICAL APPARATUS

This application is a 35 U.S.C. § 371 National Stage Application of PCT/EP2020/053111, filed on Feb. 7, 2020, which claims the benefit of priority to Serial No. DE 10 2019 204 758.0, filed on Apr. 3, 2019 in Germany, the disclosures of which are incorporated herein by reference in their entirety.

The disclosure relates to a checking unit for an actuation device of an electrical apparatus, for example an electrically controllable parking brake.

BACKGROUND

DE 102 61 042 B3 describes a parking brake for vehicles which is designed as an electromechanical braking apparatus with an electric brake motor for generating a parking brake force. When the brake motor is actuated, a brake piston is moved in the direction of a brake disk.

To actuate the parking brake, an actuation switch is usually activated, which can be manually moved between a switch-on and a switch-off position. When it is switched on, a corresponding signal is forwarded to a control unit, which is assigned to the electric brake motor. The signal transmission starting from the actuation switch is carried out via several signal lines. When the actuation switch is functioning correctly, the corresponding signals for switching on and off are forwarded to the control unit via the signal lines.

SUMMARY

The checking unit according to the disclosure is used to check the current switching state and to determine a fault in an actuation device which is assigned to an electrical apparatus and via which the electrical apparatus can be switched on. The actuation device is, in particular, a manually adjustable actuation device, for example an actuation switch in a vehicle, via which an electrical apparatus in the vehicle is switched on and, if necessary, also switched off again. For example, an application to an electrically actuatable parking brake is possible, in which a braking force is generated with the aid of an electric brake motor when the vehicle is at a standstill and, if necessary, a braking force is also generated while the vehicle is moving.

Advantageously, the electrical apparatus can also be switched off again or actuated in the opposite direction via the actuation device. Alternatively, it is also possible for the electrical apparatus to be switched off or actuated in the opposite direction automatically. For example, in the case of an electrically actuatable parking brake, the electric brake motor is switched off automatically after a defined braking force has been reached. The switched-off state of the electric brake motor can be transferred back to the actuation device, whereupon the latter is automatically set to a switched-off state if necessary.

The checking unit is embodied as an ASIC (application-specific integrated circuit) which can be connected to the signal lines of the actuation device. The ASIC comprises a test circuit for generating a voltage test sequence which is applied to at least one signal line of the actuation device for test purposes. Furthermore, the ASIC comprises a memory for storing a response pattern that is generated in response to the voltage test sequence in the signal lines, and an evaluation unit for comparing the response pattern with a reference pattern. The reference pattern corresponds to the correct functioning of the actuation device in response to the voltage test sequence.

This embodiment has various advantages. The embodiment of the checking unit as an ASIC comprises all components required for checking the functionality of the actuation device. The checking unit is not embodied as a microcontroller or is not integrated into a microcontroller, but rather is designed independently of a microcontroller. The checking unit as an ASIC represents a specialized assembly which, in particular, does not perform any functions beyond testing the functionality of the actuation device. The checking unit can perform the necessary test procedures autonomously and independently of a microcontroller.

During the check, a voltage test sequence is applied to at least one signal line in the checking unit, which can be connected to the actuation device, wherein the response pattern which is produced in response to the voltage test sequence is stored in the memory in all the signal lines and is compared with the associated response pattern in the evaluation unit. It may be advantageous to apply a voltage test sequence to all of the signal lines for test purposes, wherein each resulting response pattern is stored and compared with an associated reference pattern. For example, between two and six signal lines are provided, to each of which a voltage test sequence is applied. In an embodiment example with a total of six signal lines, this results in six response patterns, which are correspondingly set against six reference patterns for comparison. Each response pattern contains information about the responses in each signal line.

For correct functioning, the response pattern must match the associated reference pattern. In case of a deviation, there is an error either in the actuation device or in the signal lines, resulting in an error signal which is stored and/or displayed.

Due to the error signal, a malfunction of the actuation device can be identified.

In the case of a plurality of voltage test sequences, all response patterns must match the associated reference patterns in order to conclude that there are no errors. However, if there is only a partial match it may be advantageous to retain partial functionality of the actuation device, and this may be displayed in order to indicate the limited functionality to the operator.

The response pattern in the signal lines, which occurs in response to the applied voltage test sequence, is embodied as a voltage pattern of the signal lines, which voltage pattern results from the interconnection of the signal lines or a possibly existing error. On the basis of the voltage pattern that actually occurs, a possible error can be concluded by comparison with the reference pattern.

According to a further advantageous embodiment, the test circuit of the checking unit is provided with an internal function checking device. The function checking device in the test circuit allows a function check which is limited to the functionality of the test circuit. According to an advantageous further refinement, the test circuit comprises a first generator for generating the trigger signals that generate the desired voltage test sequence and a second generator for generating a corresponding trigger signal pattern. The signals of the first and second generators are compared with one another, wherein, in the case of a match, functionality is assumed, whereas, in the case of a deviation, a fault is present.

In the case of a match, a confidence bit can be generated, which is stored in a memory unit of the test circuit.

If necessary, a test bit can be generated in the test circuit for test purposes, which test bit has the function of an interfering signal and is used instead of the trigger signals of the second generator for a comparison with the signals of the first generator. In this case, a mismatch must be determined during the comparison, provided that a correct functionality is present. If this is the case, a confidence bit can also be generated.

Another aspect of the disclosure relates to a method for actuating the checking unit, which checking unit is embodied in the manner described above. In the method, the voltage test sequence generated in the test circuit of the checking unit comprises a plurality of temporally successive voltage changes, each of which is applied to a signal line of the actuation device. An error signal is generated if there is a deviation between the response pattern and the reference pattern. Advantageously, a voltage change is generated in each signal line in order to realize the voltage test sequence, which voltage changes are implemented in the signal lines temporally alternately or successively. It is particularly expedient here for all signal lines to be subjected alternately to a changed voltage level in different voltage test sequences. However, it may also be sufficient that only some of the signal lines are subjected to a voltage change in a temporally alternating sequence. During the voltage change, in particular the voltage in the signal line is set from a higher to a lower level, in particular to zero. In response to this, the response pattern is established in the signal lines and is compared with the reference pattern, as described above.

The disclosure further relates to an actuation and monitoring system comprising an actuation device for actuating an electrical apparatus and comprising a previously described checking unit implemented as an ASIC. The actuation and monitoring system is additionally assigned a microcontroller that is separate from the checking unit but connected to the checking unit. The microcontroller communicates with the checking unit and is able, for example, to configure the voltage test sequence generated in the test circuit in the checking unit. The microcontroller can additionally receive results from the evaluation unit of the checking unit and can process them if necessary.

Another aspect of the disclosure relates to a method for actuating the previously described actuation and monitoring system. In the method, the microcontroller actuates the test circuit in the checking unit and, if necessary, obtains the result of the comparison of the response pattern with the reference pattern.

The disclosure further relates to a parking brake for immobilizing a vehicle at a standstill, wherein the parking brake comprises an electromechanical braking apparatus having an electric brake motor. The parking brake is additionally provided with a control unit for controlling the adjustable components of the parking brake, and with a previously described actuation and monitoring system for switching the parking brake on and off and for checking the actuation device. The microcontroller of the actuation and monitoring system may, if necessary, be part of the control unit of the parking brake.

The checking unit can be integrated into the control unit of the parking brake, if necessary.

BRIEF DESCRIPTION OF THE DRAWINGS

Further advantages and expedient embodiments can be found in the further claims, the description of the figures, and the drawings, in which:

In the figures, like components have been provided with like reference signs.

DETAILED DESCRIPTION

Figure 1:
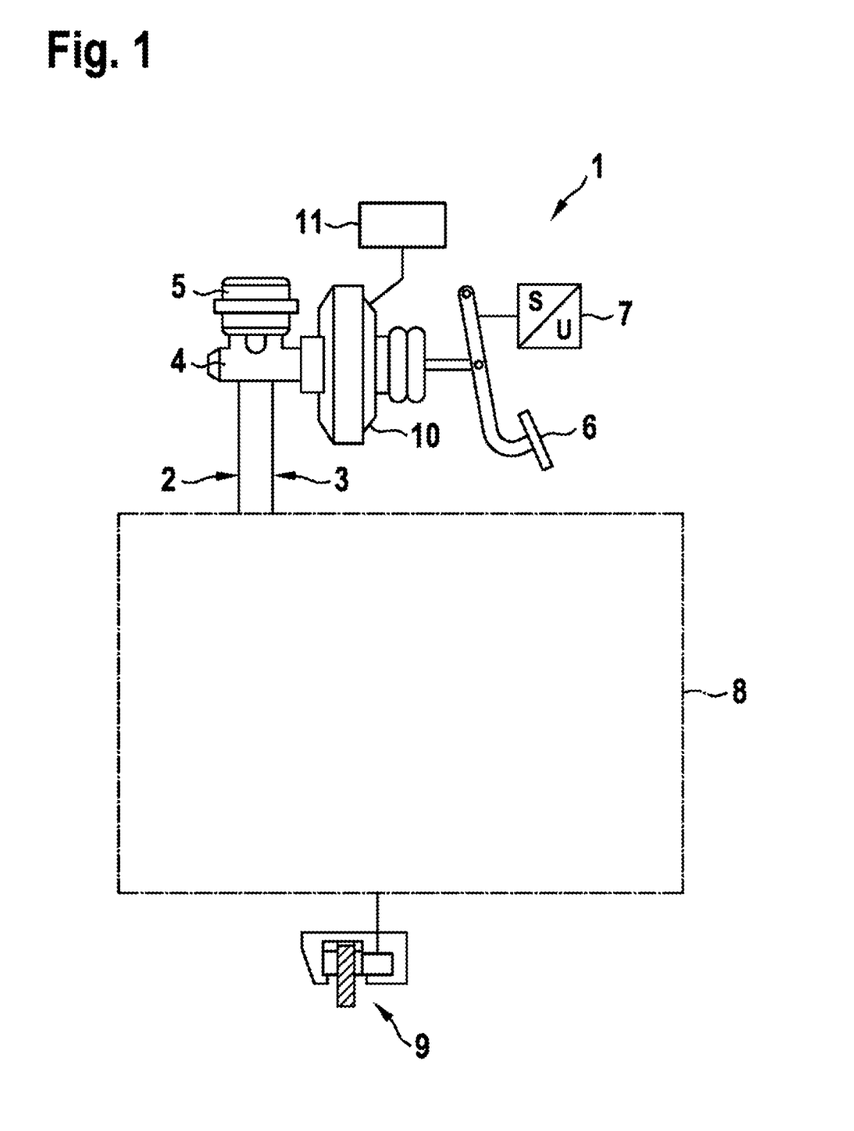
FIG. 1 shows a schematic representation of a hydraulic vehicle brake with a brake booster, wherein the wheel braking devices of the vehicle brake on the rear axle of the vehicle additionally have an electromechanical braking apparatus with an electric brake motor.

The hydraulic vehicle brake 1, shown in FIG. 1, for a vehicle comprises a front-axle brake circuit 2 and a rear-axle brake circuit 3 for supplying and controlling wheel braking devices 9 on each wheel of the vehicle with a brake fluid placed under hydraulic pressure. The two brake circuits 2, 3 are connected to a common master brake cylinder 4, which is supplied with brake fluid via a brake fluid supply reservoir 5. The master brake cylinder piston within the master brake cylinder 4 is actuated by the driver via the brake pedal 6, and the pedal travel exerted by the driver is measured via a pedal travel sensor 7. Between the brake pedal 6 and the master brake cylinder 4 there is a brake booster 10 comprising, for example, an electric motor, which preferably actuates the master brake cylinder 4 via a transmission.

The actuating movement of the brake pedal 6 measured by the pedal travel sensor 7 is transmitted as a sensor signal to a closed-loop or open-loop control unit 11, in which actuating signals are generated to control the brake booster 10. The wheel braking devices 9 are supplied with brake fluid in each brake circuit 2, 3 via various switching valves, which, together with other units, form part of a brake hydraulic system 8. The brake hydraulics system 8 also includes a hydraulic pump, which is part of an electronic stability program (ESP).

Figure 2:
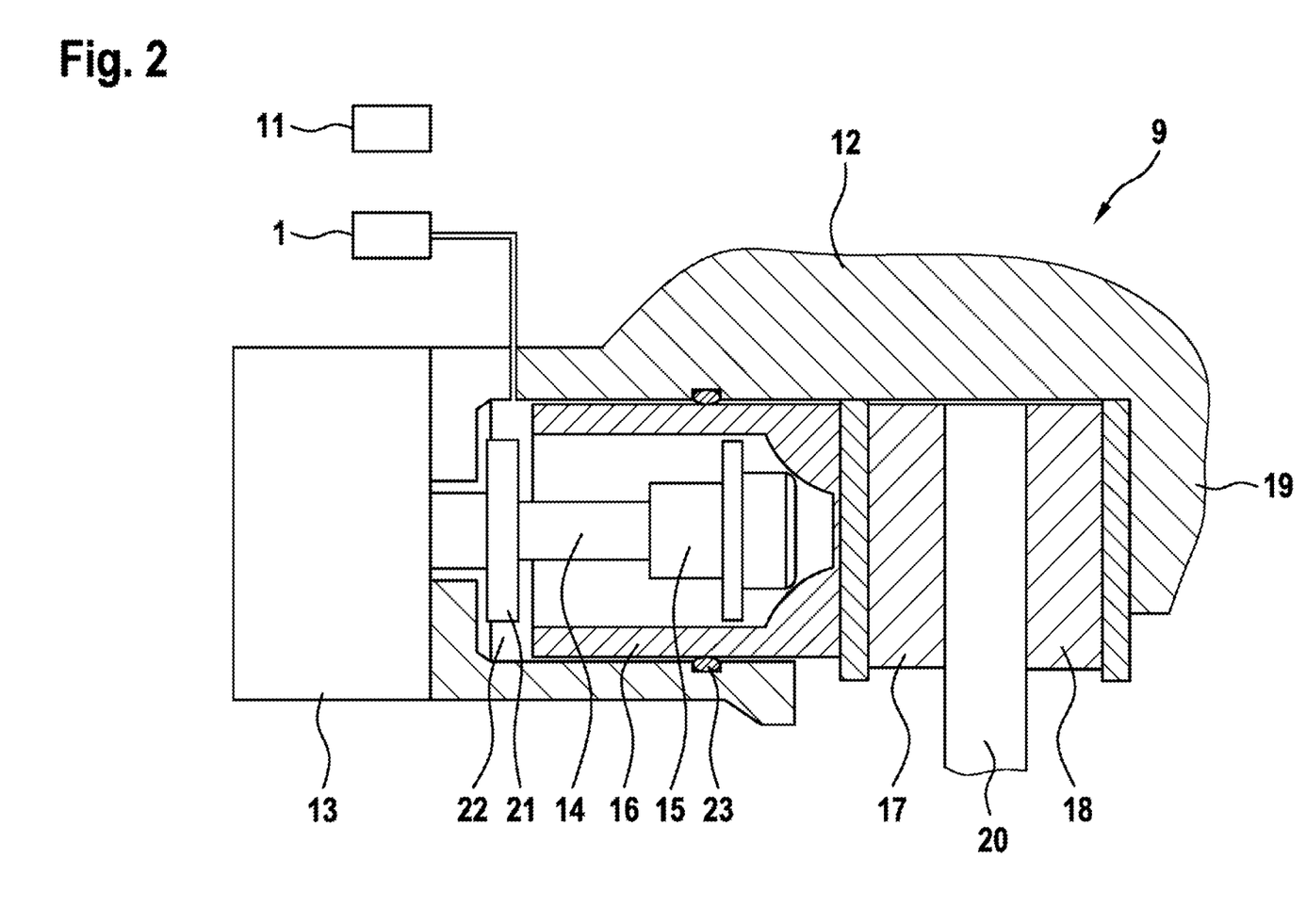
FIG. 2 shows a section through an electromechanical braking apparatus with an electric brake motor.

FIG. 2 shows in detail the wheel braking device 9, which is arranged on a wheel on the rear axle of the vehicle. The wheel braking device 9 is part of the hydraulic vehicle brake 1 and is supplied with brake fluid 22 from the rear-axle brake circuit. The wheel braking device 9 additionally has an electromechanical braking apparatus which is preferably used as a parking brake for immobilizing a vehicle when it is stationary, but which can also be used to brake the vehicle when it is moving, in particular at lower vehicle speeds below a speed limit.

The electromechanical braking apparatus comprises a caliper unit 12 with a caliper 19 which engages over a brake disk 20. As an actuation member, the braking apparatus has a DC electric motor as a brake motor 13, the rotor shaft of which drives a spindle 14 in rotation, on which spindle a spindle nut 15 is mounted in a rotationally fixed manner. When the spindle 14 rotates, the spindle nut 15 is axially moved. The spindle nut 15 moves within a brake piston 16, which is the carrier of a brake pad 17, which is pressed against the brake disk 20 by the brake piston 16. On the opposite side of the brake disk 20 is another brake pad 18, which is held in a stationary manner on the caliper 19. The brake piston 16 is sealed pressure-tightly on its outside against the receiving housing by a surrounding ring seal 23.

Within the brake piston 16, the spindle nut 15 can move axially forward toward the brake disk 20 when the spindle 14 rotates or axially rearward until it reaches a stop 21 when the spindle 14 rotates in the opposite direction. To generate a clamping force, the spindle nut 15 acts on the inner end face of the brake piston 16, as a result of which the brake piston 16, which is axially displaceably mounted in the braking apparatus, is pressed with the brake lining 17 against the facing end face of the brake disk 20.

For the hydraulic braking force, the hydraulic pressure of the brake fluid 22 from the hydraulic vehicle brake 1 acts on the brake piston 16. The hydraulic pressure can also have a supporting effect when the vehicle is at a standstill and the electromechanical braking apparatus is actuated, so that the total braking force is made up of the component supplied by the electric motor and the hydraulic component. While the vehicle is moving, either only the hydraulic vehicle brake is active, or both the hydraulic vehicle brake and the electromechanical braking apparatus are active, or only the electromechanical braking apparatus is active to generate braking force. The actuating signals for controlling both the adjustable components of the hydraulic vehicle brake 1 and the electromechanical wheel braking device 9 are generated in the regulating or control unit 11.

Figure 3:
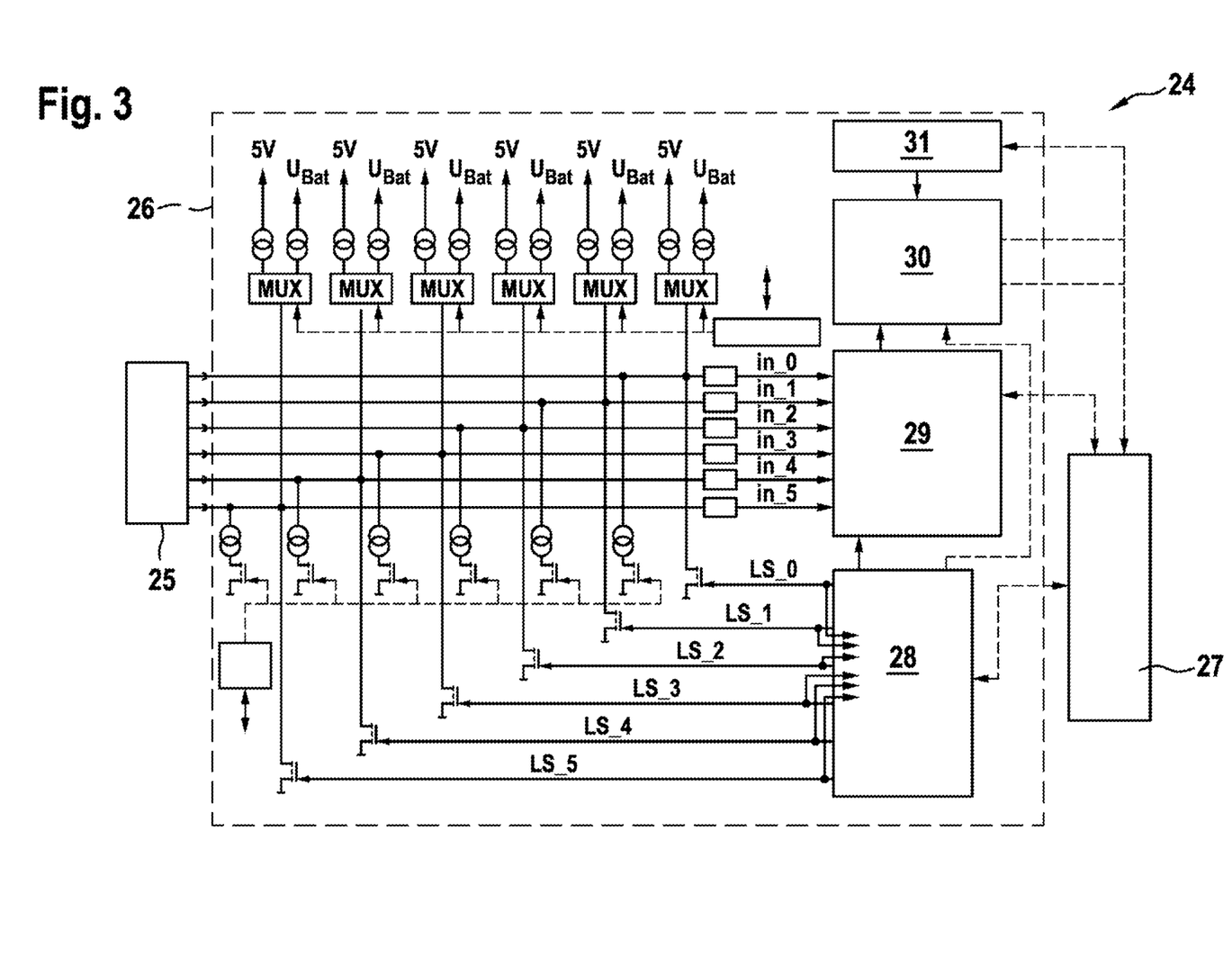
FIG. 3 shows a circuit diagram comprising an actuation and monitoring system with an actuation device for actuating the electromechanical braking apparatus and with a checking unit for monitoring the actuation device, and with a microcontroller communicating with the actuation and monitoring system.

FIG. 3 shows a circuit diagram with an actuation and monitoring system 24, which comprises an actuation device 25, designed as a switch, and a checking unit 26. The checking unit 26 communicates with a microcontroller 27, which, if necessary, may be part of the control unit 11, via which the electric control motor of the parking brake is controlled. The checking unit 26 may also be integrated into the control unit or connected to the control unit.

The actuation device 25 forms a switch and can be activated by the driver to actuate the parking brake. The actuation device 25 is connected to the checking unit 26 via a total of six signal lines IN_0 to IN_5.

The checking unit 26 is used to check the functionality of the actuation device 25. For this purpose, a voltage test sequence is generated in the checking unit 26 and is applied to the signal lines IN_0 to IN_5. In addition to the response pattern in the signal lines—the voltage values that occur in response to the voltage test sequence—it is possible to determine whether the actuation device 25 is functioning properly by comparing the response pattern with an assigned reference pattern.

The actuation device 26 comprises various components and is designed as an ASIC that is independent of the microcontroller 27. The actuation device 25 comprises a test circuit 28, in which a voltage test sequence is generated which is applied to the signal lines IN_0 to IN_5. Furthermore, the actuation device 25 comprises a memory 29 for storing the response pattern in the signal lines IN_0 to IN_5 and an evaluation unit 30 for comparing the response pattern in the memory 29 with a reference pattern stored in a further memory unit 31 and with a desired response pattern for the case of full functionality. corresponds.

Figure 4:
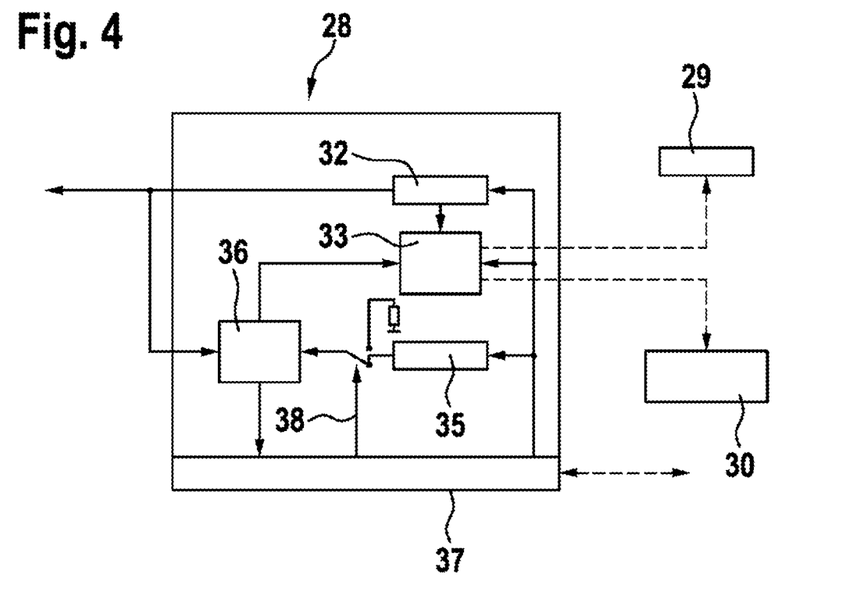
FIG. 4 shows a circuit diagram of a test circuit for generating a voltage test sequence, used to check the functionality of the actuation device.
Figure 5:
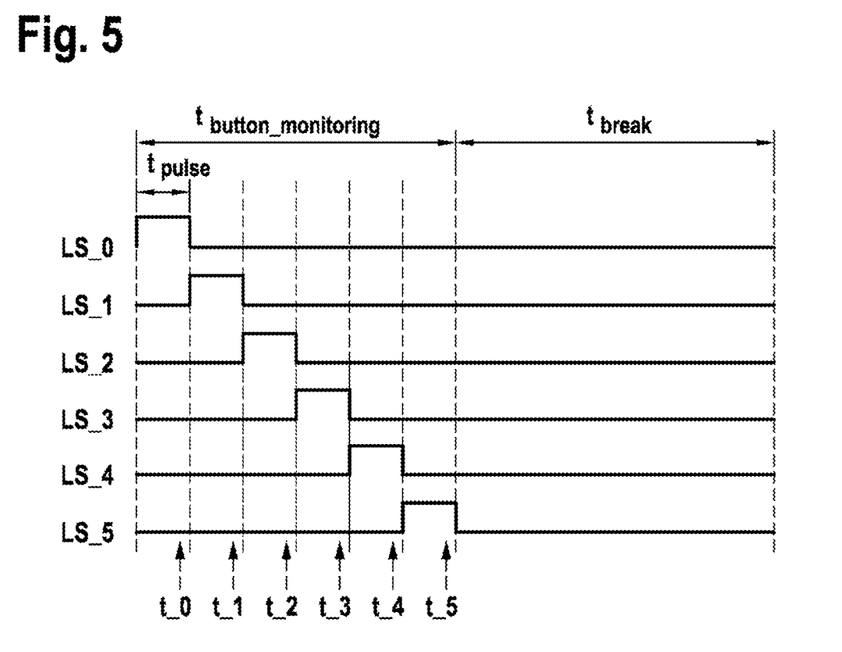
FIG. 5 shows a graph depicting the temporal profile of the control for generating the voltage test sequence.

FIG. 4 shows the test circuit 28 in detail, and FIG. 5 shows the temporal profile of the trigger signals for generating various voltage test sequences. The test circuit 28 according to FIG. 4 comprises a first generator 32, in which the trigger signals shown in FIG. 5 are generated. These trigger signals are synchronized in a synchronization logic unit 33 with different times t_0 to t_5, and, in addition, the unit 33 determines the time at which the evaluation time takes place after different voltage test sequences have been performed. From the synchronization logic unit 33, a transfer is made to the memory unit 29, which is part of the checking unit 26. In addition, the start time at which the comparison between the response pattern and the reference pattern takes place is transferred to the evaluation unit 30.

The test circuit 28 is additionally provided with an internal function checking device, by means of which the functionality of the test circuit 28 can be checked. The internal function checking unit comprises a second generator 35 and a comparison block 36. A comparison pattern is generated in the second generator 35 and is compared in the comparison block 36 with the trigger signals from the first generator 32 representing the reference pattern. If the patterns from the first generator 32 and the second generator 35 match, a confidence bit is generated and stored in an internal memory 37 of the test circuit 28.

Furthermore, for test purposes, it is possible to upload from the internal memory 37 a test bit 38 which replaces the signals of the second generator 35 and has the function of an interfering signal. When a comparison is made in the comparison block 36 with the trigger signals of the first generator 32, a mismatch must be determined under normal functioning conditions, which in turn leads to a corresponding confidence bit.

FIG. 5 shows the temporal profile of trigger signals LS_0 to LS_5. At times t_0 to t_5, a signal greater than zero is present in each signal profile LS_0 to LS_5 in a temporally successive manner. This signal greater than zero has the time duration $t_{pulse}$. Only one non-zero signal is active in each of the different trigger signals LS_0 to LS_5. The trigger signals LS_0 to LS_5 in each case generate a voltage test sequence at each time t_0 to t_5.

At the beginning of the test sequence, a signal greater than zero is generated only in the first trigger signal LS_0, whereas in the other trigger signals the signal value is zero. This causes the associated low side switch to be switched to ground, so that the voltage level in the associated signal line IN_0 is set to zero. The other signal lines IN_1 to IN_5, on the other hand, remain at the voltage level they receive from their current source, unless they are connected to signal line IN_0 via the actuation device; in that case they are also set to zero. The response signals in each signal line IN_0 to IN_5 collectively represent the response pattern at that time, which is stored in memory 29. The start time for reading into the memory 29 is generated by the synchronization logic unit 33. This process is repeated for the profile of the trigger signals LS_1 to LS_5, as shown in FIG. 5. Accordingly, there are a total of six runs, so that the response pattern contains a total of 6×6=36 pieces of information that are stored in the memory 29.

After a complete run of the voltage test sequence which has elapsed at the end of the time period $t_{button\_monitoring}$, the comparison is made in the evaluation unit 30 of the checking unit 26 with the reference pattern, which is stored in the memory unit 31. If the response pattern from the memory 29 corresponds to the reference pattern, there is no error, so that it can be assumed that the actuation device 25 is functioning properly. On the other hand, if there is a deviation between the response pattern and the reference pattern, there is an error, which results in a corresponding error signal being supplied to the microcontroller 27.

As FIG. 5 also shows, the time period $t_{button\_monitoring}$, in which the voltage test sequence is generated, is followed by another time period $t_{break}$, in which no voltage test sequence is generated.

The invention claimed is:

1. A checking unit for an actuation device of an electrical apparatus, comprising:
an ASIC configured for connection to at least one signal line of the actuation device, the ASIC including (i) a test circuit configured to generate a voltage test sequence to be applied to the at least one signal line, (ii) a memory configured to store a response pattern from the actuation device in the at least one signal line, and (iii) an evaluation unit configured to compare the response pattern with a reference pattern corresponding to a correct functioning of the actuation device based on the voltage test sequence,
wherein the test circuit includes an internal function checking device configured to check the functionality of the test circuit,
wherein the test circuit includes a first generator configured to generate trigger signals that result in the generation of the voltage test sequence,
wherein the internal function checking device includes a second generator configured to generate a trigger signal pattern that corresponds to the trigger signals, and
wherein the internal function checking device is configured to compare the trigger signals to the corresponding trigger signal pattern and (i) to determine that the test circuit is functional when the trigger signals match the corresponding trigger signal pattern, and (ii) to determine that a fault is present in the test circuit when the trigger signals deviate from the corresponding trigger signal pattern.

2. The checking unit as claimed in claim 1, wherein:
the actuation device includes from two to six of the signal lines, and
the voltage test sequence is assigned in a test phase to each of the signal lines.

3. The checking unit as claimed in claim 1, wherein:
the checking unit, the actuation device, and a microcontroller are included in an actuation and monitoring system,
the actuation device is configured to actuate the electrical apparatus, and
the microcontroller is separate from the checking unit and connected to the checking unit.

4. The checking unit as claimed in claim 3, wherein the test circuit is controlled in the microcontroller.

5. The checking unit as claimed in claim 3, wherein a result of the comparison of the response pattern with the reference pattern is transmitted to the microcontroller.

6. The checking unit as claimed in claim 1, wherein:
the ASIC is further configured to generate a confidence bit when the trigger signals match the corresponding trigger signal pattern, and
the confidence bit is stored in the memory.

7. A method for actuating a checking unit for an actuation device of an electrical apparatus, the method comprising:
generating a voltage test sequence in a test circuit of the checking unit, the voltage test sequence including a plurality of temporally successive voltage changes;
applying the voltage test sequence to at least one signal line of the actuation device;
storing a response pattern from the actuation device in the at least one signal line to the voltage test sequence in a memory of the checking unit;
comparing the response pattern with a reference pattern corresponding to a correct functioning of the actuation device based on the voltage test sequence with an evaluation unit of the checking unit;
generating an error signal when the response pattern deviates from the reference pattern with the checking unit;
checking the functionality of the test circuit with an internal function checking device by:
generating trigger signals that result in the generation of the voltage test sequence with a first generator of the internal function checking device,
generating a trigger signal pattern that corresponds to the trigger signals with a second generator of the internal function checking device, the trigger signal pattern corresponding to the trigger signals, and
determining that the test circuit is functional when a comparison of the trigger signals to the corresponding trigger signal pattern is a match, and
determining that a fault is present in the test circuit when the comparison of the trigger signals to the corresponding trigger signal pattern shows a deviation.

8. The method as claimed in claim 7, further comprising:
setting a voltage level temporally alternately from a higher level to a lower level to realize the voltage test sequence in the at least one signal line.

9. The method as claimed in claim 7, further comprising:
comparing, after each voltage change, a current voltage state in the at least one signal line representing the response pattern with the reference pattern.

10. A parking brake for immobilizing a vehicle, comprising:
an electromechanical braking apparatus including an electric brake motor configured to move a brake piston in a direction of a brake disk;
a control unit configured to control adjustable components of the parking brake; and
an actuation and monitoring system configured to switch the electromechanical braking apparatus on and off and to check an actuation device, the actuation and monitoring system including a checking unit, the actuation device, and a microcontroller, the actuation device configured to actuate the electrical apparatus, and the microcontroller separate from the checking unit and connected to the checking unit,
wherein the checking unit includes an ASIC configured for connection to at least one signal line of the actuation device, and
wherein the ASIC includes (i) a test circuit configured to generate a voltage test sequence to be applied to the at least one signal line of the actuation device, (ii) a memory configured to store a response pattern from the actuation device in the at least one signal line, and (iii) an evaluation unit configured to compare the response pattern with a reference pattern which corresponds to a correct functioning of the actuation device based on the voltage test sequence,
wherein the test circuit includes an internal function checking device configured to check the functionality of the test circuit,
wherein the test circuit includes a first generator configured to generate trigger signals that result in the generation of the voltage test sequence,
wherein the internal function checking device includes a second generator configured to generate a trigger signal pattern that corresponds to the trigger signals, and
wherein the internal function checking device is configured to compare the trigger signals to the corresponding trigger signal pattern and (i) to determine that the test circuit is functional when the trigger signals match the corresponding trigger signal pattern, and (ii) to determine that a fault is present in the test circuit when the trigger signals deviate from the corresponding trigger signal pattern.

11. The parking brake as claimed in claim 10, wherein the microcontroller is part of the control unit.

* * * * *